(12) United States Patent
Sato

(10) Patent No.: US 8,410,525 B2
(45) Date of Patent: Apr. 2, 2013

(54) COMPOUND SEMICONDUCTOR SUBSTRATE AND DEVICE THEREWITH

(75) Inventor: Ken Sato, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 188 days.

(21) Appl. No.: 12/619,110

(22) Filed: Nov. 16, 2009

(65) Prior Publication Data
US 2010/0123169 A1   May 20, 2010

(30) Foreign Application Priority Data
Nov. 19, 2008   (JP) .................... 2008-295526

(51) Int. Cl.
*H01L 29/66*   (2006.01)
(52) U.S. Cl. .......... 257/194; 257/192; 257/200
(58) Field of Classification Search ........... 257/192, 257/194, 200
See application file for complete search history.

(56) References Cited

U.S. PATENT DOCUMENTS
2007/0029557 A1*   2/2007   Vaufrey et al. ............ 257/94
2009/0189188 A1*   7/2009   Matsushita ............ 257/192

FOREIGN PATENT DOCUMENTS
JP   2000-349278   * 12/2000
JP   2003-59948   2/2003

* cited by examiner

Primary Examiner — Tan N Tran
(74) Attorney, Agent, or Firm — Oblon, Spivak, McClelland, Maier & Neustadt, L.L.P.

(57) ABSTRACT

A semiconductor device is formed on a semiconductor substrate, which is comprised of: a base substrate; and a multilayer being formed on the base substrate and having a surface serving for an interface with the semiconductor device, the multilayer including alternating layers of a first compound semiconductor and a second compound semiconductor materially distinguishable from the first compound semiconductor, one selected from the group consisting of the first compound semiconductor and the second compound semiconductor being doped with one selected from the group consisting of carbon and transition elements.

7 Claims, 4 Drawing Sheets

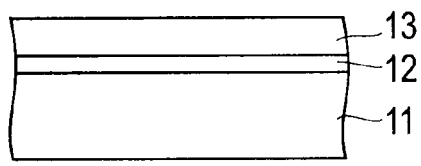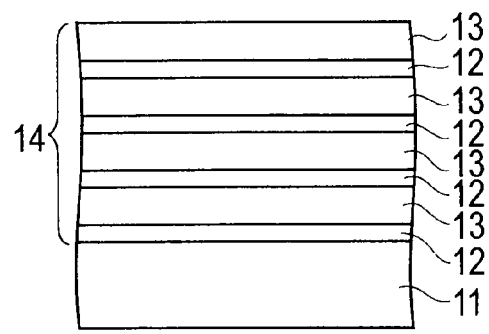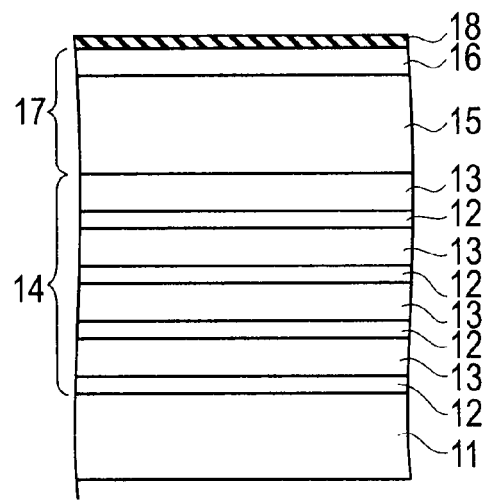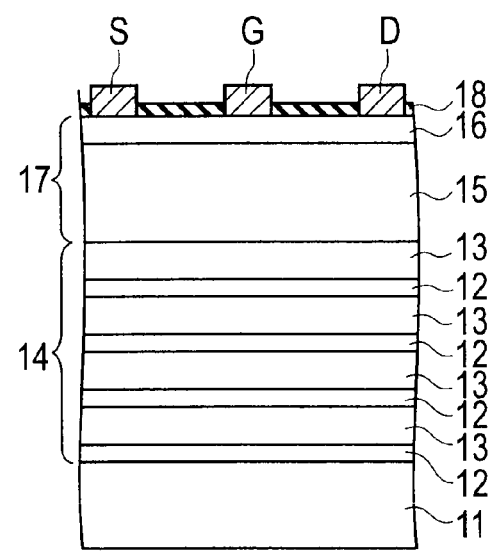

COMPOUND SEMICONDUCTOR SUBSTRATE AND DEVICE THEREWITH

CROSS-REFERENCE TO RELATED APPLICATIONS

This application is based upon and claims the benefit of priority from the prior Japanese Patent Application No. 2008-295526 (filed Nov. 19, 2008); the entire contents of which are incorporated herein by reference.

BACKGROUND OF THE INVENTION

1. Field of the Invention

The present invention relates to a compound semiconductor substrate and a device to which the compound semiconductor substrate is applied.

2. Description of the Related Art

A transistor having a hetero junction of compound semiconductors so as to generate two-dimensional electron gas is known as "high-electron-mobility transistor", or its shortened form "HEMT". Because of its high electron mobility, HEMTs are widely used for producing high-speed switching devices. As formation of the hetero junction in general requires epitaxy of good quality, single-crystalline GaN or sapphire is in general used as a substrate.

Recently, application of Si and SiC has been urgently studied because of its better thermal conductivity, better availability and reasonable costs. However, Si and SiC considerably differ from the compound semiconductors in lattice constant. Any compound semiconductors epitaxially grown on Si or SiC have lattice mismatching and therefore cause strain in the structure, which affects electric properties of the transistor.

Interposition of any buffer structure to ease lattice mismatching may prevent generation of strain. Some studies in this way have achieved a level of success in producing HEMT structures on Si or SiC substrates. However, thus produced structures still fail to perform satisfactory electric properties particularly in view of a switching speed and a high-frequency property.

SUMMARY OF THE INVENTION

The present invention is to provide a compound semiconductor substrate which gives improved electric properties to a HEMT and a HEMT device to which the substrate is applied.

According to a first aspect of the present invention, a semiconductor substrate serving for production of a semiconductor device is comprised of: a base substrate; and a multilayer being formed on the base substrate and having a surface serving for an interface with the semiconductor device, the multilayer including alternating layers of a first compound semiconductor and a second compound semiconductor materially distinguishable from the first compound semiconductor, one selected from the group consisting of the first compound semiconductor and the second compound semiconductor being doped with one selected from the group consisting of carbon and transition elements.

According to a second aspect of the present invention, a semiconductor device is comprised of: a base substrate; a multilayer being formed on the base substrate and having a surface, the multilayer including alternating layers of a first compound semiconductor and a second compound semiconductor materially distinguishable from the first compound semiconductor, one selected from the group consisting of the first compound semiconductor and the second compound semiconductor being doped with one selected from the group consisting of carbon and transition elements; a device layer including a first region formed on the surface of the multilayer and a second region forming a hetero junction with the first region; and first and second contacts being apart from each other and respectively forming ohmic contacts with the device layer.

BRIEF DESCRIPTION OF THE DRAWINGS

FIGS. 2A-2D are schematic drawing illustrating a production process of the HEMT device;

DETAILED DESCRIPTION OF THE PREFERRED EMBODIMENT

Certain embodiments of the present invention will be described hereinafter with reference to the appended drawings.

Although the following description will be given to a case in which the invention is applied to a HEMT, the present invention may be applied to any semiconductor devices, such as a MOS transistor and a diode.

Figure 1:
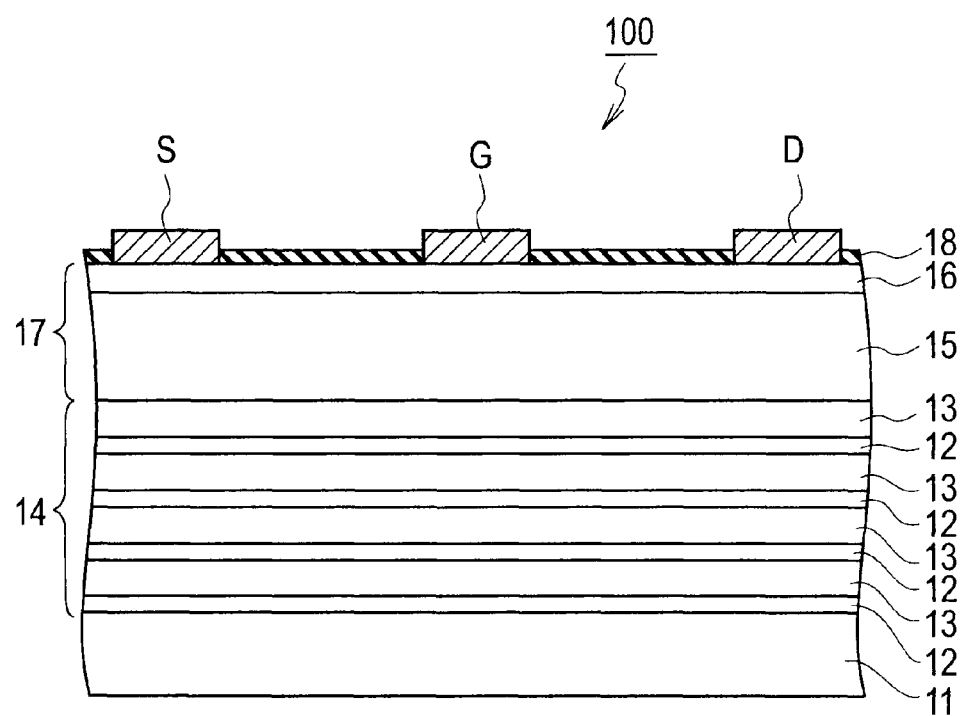
FIG. 1 is a cross sectional view of a HEMT device according to a first embodiment of the present invention.

Referring to FIG. 1, any structures pertinent to a HEMT 100 is formed on a base substrate 11 consisting essentially of single crystalline silicon. Instead of silicon, any material readily available and of a reasonable cost, such as silicon carbide, may be applied to the base substrate 11.

A multilayer 14 is formed on the base substrate 11 and has an interface with a device layer 17 described later on the top thereof. The multilayer 14 is comprised of alternating layers of a first compound semiconductor 12 and a second compound semiconductor 13. The number of the alternating layers may be several tens, whereas FIG. 1 only illustrates an example in which four paired layers 12,13 are layered, but is of course properly selected.

A combination of materials applied to the first compound semiconductor 12 and the second compound semiconductor 13 should be appropriately selected from wide variety of compound semiconductors so as to allow epitaxial growth of the device layer 17 and further moderate a strain induced by differences in lattice constant among the base substrate 11, the multilayer 14 and the device layer 17. More specifically, a material applied to the first compound semiconductor 12 should have a lattice constant relatively close to that of the material applied to the base substrate 11, a material applied to the second compound semiconductor 13 should have a lattice constant relatively close to that of a channel region 15 (described later) of the device layer 17, and further these lattice constants of the first and second compound semiconductors 12 and 13 should also moderately differ from each other. Therefore the second compound semiconductor 13 is inherently materially distinguishable from the first compound semiconductor 12. Given that the base substrate 11 is of silicon and the device layer 17 has an AlGaN/GaN hetero junction structure, an example of material combinations is that the first compound semiconductor 12 is of aluminum nitride (AlN) and the second compound semiconductor 13 is of gallium nitride (GaN) with or without a dopant described later.

At least the second compound semiconductor 13 is doped with carbon or any transition element such as iron (Fe). Alternatively, it may be modified into a structure in which only some of the layers are doped and the others are left non-doped.

According to the inventor's studies, the second compound semiconductor layers 13, if it were non-doped, would tend to have relatively high conductivity because a greater band gap of the adjacent first compound semiconductor layers 12 might induce relatively abundant carriers in the second compound semiconductor layers 13 by means of a piezo electric field or its vacancies at nitrogen sites. As the second compound semiconductor layers 13 are conductive and the interposed first compound semiconductor layers 12 are less conductive, the multilayer would function as parasitic capacitors connected in series in the vertical direction. The present inventor has found out that this effect considerably deteriorates electric properties of HEMT structures on Si or SiC substrates under study and has solved this problem by doping the second compound semiconductor layers 13 with an element that decreases its conductivity, namely carbon or any transition element such as iron (Fe). Any of carbon and transition elements is capable of substituting for Ga or Al sites in the compound semiconductor crystal to generate deep levels, thereby decreasing conductivity.

The device layer 17 is formed on the multilayer 14. The device layer 17 is comprised of the channel region 15 epitaxially grown on the multilayer 14 and a barrier layer 16 formed on the channel region 15. Interposed between the channel region 15 and the barrier layer 16, any intervening region may be formed. The combination of the channel region 15 and the barrier layer 16 forms a hetero junction so as to generate two-dimensional electron gas in the channel region 15 along the barrier layer 16. Thus a combination of materials applied to the channel region 15 and the barrier layer 16 should be appropriately selected from the compound semiconductors. An example is that the channel region 15 is of non-doped gallium nitride (GaN) and the barrier layer 16 is of aluminum-gallium nitride (AlGaN) doped with any dopant.

Further an insulator layer 18 having predetermined apertures is formed on the barrier layer 16 and, source, drain, and gate contacts are formed on the barrier layer 16 through the apertures. These contacts are properly apart from each other. The source and drain contacts S,D respectively form ohmic contacts with the barrier layer 16, whereas the gate contact G forms a Schottky contact.

The HEMT 100 having the aforementioned structure provides the following advantages. As the multilayer 14 buffers lattice constant differences between the base substrate 11 and the device layer 17, a strain induced in the hetero junction is effectively relaxed. Further the multilayer 14 electrically modified by the dopant effectively reduces parasitic capacitance. Therefore the present embodiment provides better applicability of easily available materials such as silicon without a disadvantage in view of the issue of parasitic capacitance. The reduced parasitic capacitance further provides a higher switching speed and a reduced loss when the HEMT 100 is used as a switching device. Simultaneously, the doped multilayer 14 has relatively high resistance and therefore the HEMT 100 has high breakdown voltage.

Production of the aforementioned HEMT 100 is executed in a way as described hereinafter. Although the following description will be given to an example only, in which the base substrate 11, the multilayer 14 and the device layer are of a Si/AlN/GaN/GaN/AlGaN system, the present embodiment is of course not limited thereto. Further, although a well-known metal-organic chemical vapor deposition (MOCVD) method is used for each epitaxial film growth in the following description, this is no more than an example and any epitaxial growth method such as a MBE method may be instead applicable.

Referring to FIG. 2A, AlN layers 12 and GaN layers 13 are alternately formed on a Si substrate 11 by means of the MOCVD method. First, the Si substrate 11 is loaded into a reaction chamber and exposed to a reaction with trimethylaluminum (TMA) and ammonia ($NH_3$) supplied to the chamber in a form of a gas phase. Then one layer of AlN is grown up to about 10 nm in thickness for example. Next the Si substrate 11 with the layer is further exposed to a reaction with trimethylgallium (TMG) and ammonia ($NH_3$) with a proper concentration of ferrocene (($C_5H_5$)$_2$Fe) also supplied in a form of a gas phase. Then one layer of GaN doped with Fe in a concentration of $5 \times 10^{17}$-$10^{20}$ cm$^{-3}$ is grown up to about 30 nm in thickness for example on the first layer of AlN. These processes are reciprocally executed, thereby forming a multilayer 14 of alternating AlN/Fe-doped-GaN layers on the Si substrate 11 as shown in FIG. 2B. An example of the thickness of the multilayer 14 is 2 µm.

Formation of a device layer 17 on the multilayer 14 is next executed. The substrate 11 along with the multilayer 14 is further exposed to a reaction with TMG and ammonia supplied as a gas phase in a chamber, thereby forming a non-doped GaN layer from 0.5 to 3 µm in thickness. Subsequently, TMA, TMG and ammonia along with silane (or monosilane: $SiH_4$) in a gas phase are supplied to the surface thereof, thereby forming a barrier layer 16 of AlGaN about 10 nm in thickness. Further, by means of a plasma CVD method or any proper method, an insulator layer 18 of $SiO_2$ is formed on the barrier layer 16, as shown in FIG. 2C.

Next, a reactive ion etching (RIE) method is applied to the insulator layer 18 so as to form predetermined apertures penetrating the insulator layer 18. Then an evaporation method is selectively applied to the apertures so as to deposit ohmic contacts of titanium (Ti) and aluminum (Al) for source contacts S and drain contacts D and further deposit Schottky contacts of nickel (Ni) and gold (Au) for gate contacts G, as shown in FIG. 2D.

Some variations of the aforementioned structure may occur. For example, FIG. 3 shows a second embodiment as one of such variations.

Figure 3:
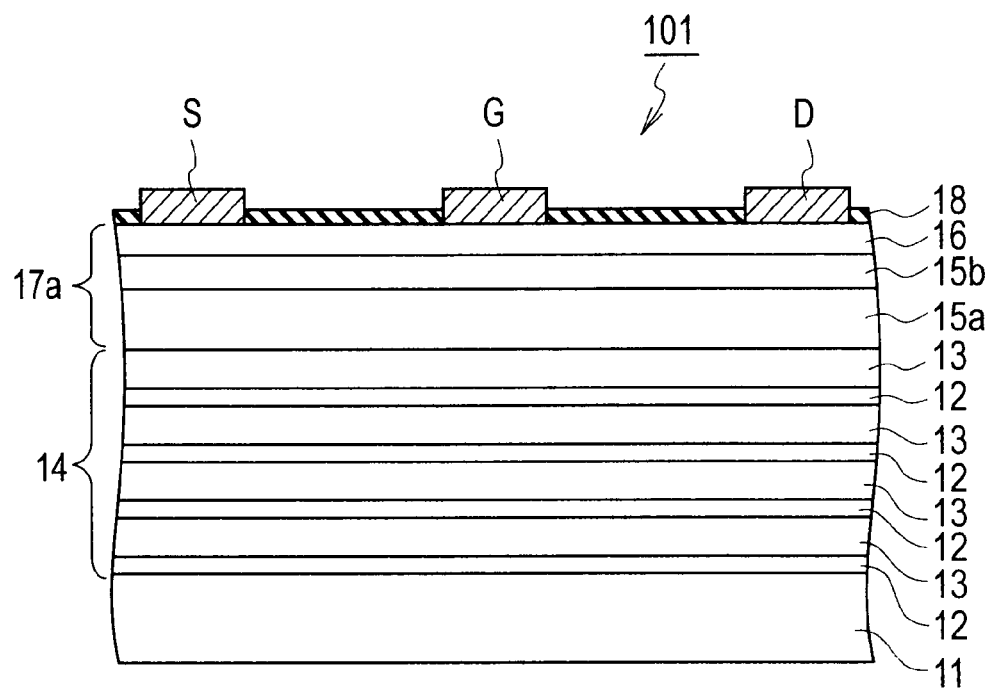
FIG. 3 is a cross sectional view of a HEMT device according to a second embodiment of the present invention.

Referring to FIG. 3, a HEMT 101 is formed on a base substrate 11 of single crystalline silicon and is comprised of a multilayer 14, a device layer 17a, an insulator layer 18 having apertures, and contacts S, D and G through the apertures, all formed on the base substrate 11, as with the first embodiment. The second embodiment differs from the first embodiment in that a channel region is comprised of two distinguishable regions, namely a first channel region 15a and a second channel region 15b.

The first channel region 15a is of GaN doped with $10^{17}$ cm$^{-3}$ or more of carbon or any transition element, epitaxially grown on the multilayer 14. The thickness may be about from 0.3 to 1 µm. Epitaxial growth of the first channel region 15a can be executed by means of any known method such as a MOCVD method with a gas phase of TMG, ammonia and a proper concentration of ferrocene.

The second channel region 15b of non-doped GaN in a thickness of about 100-200 nm is formed on the first channel region 15a. The film growth method is identical to the channel region 15 of the first embodiment.

As the first channel region 15a disposed close to the barrier layer 16 is doped with carbon or any transition element, a leak current through this region is subject to a relatively high resistance induced by the dopant. Therefore the HEMT 101 has a low leak current in an OFF state and also has high breakdown voltage.

Figure 4:
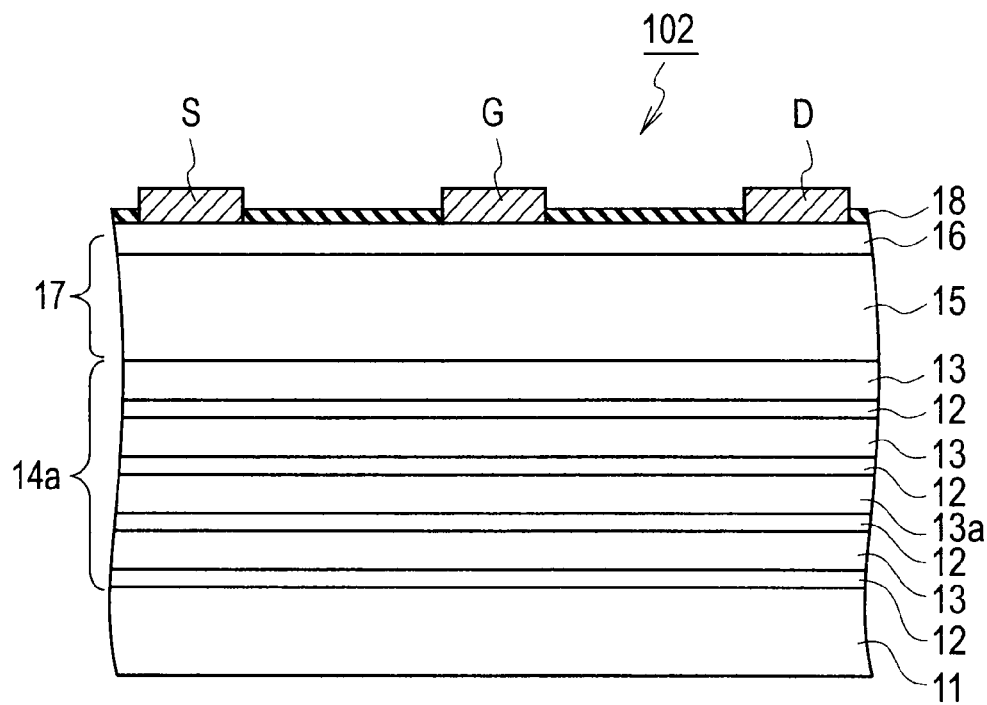
FIG. 4 is a cross sectional view of a HEMT device according to a third embodiment of the present invention.

A third embodiment as shown in FIG. 4 may be one of the variations.

Referring to FIG. 4, a HEMT 102 is formed on a base substrate 11 of single crystalline silicon and is comprised of a multilayer 14a, a device layer 17, an insulator layer 18 having apertures, and contacts S, D and G through the apertures, all formed on the base substrate 11, as with the first embodiment. The third embodiment differs from the first embodiment in that at least one of the GaN layers is non-doped or lightly doped below concentrations of $10^{16}$ cm$^{-3}$ or less, while the others are doped with carbon or any transition element. Which of the layers is selected to be non-doped or lightly-doped and the concentration of the dopant, if lightly-doped, are properly determined from the view point of the parasitic capacitance and the back side field plate effect. The non-doped or lightly-doped GaN layer 13a is formed in a thickness identical to, or different from, those of the other GaN layers 13, and can be produced in the same way as the doped GaN layers 13 by omitting or reducing ferrocene from the supplied gas phase.

The third embodiment provides the following advantages as compared with the first embodiment. The non-doped or lightly-doped GaN layer 13a keeps an electric potential substantially common with that of the gate contact G, thereby providing an effect of reducing electric field concentration around edges of the gate contact G, namely so-called "back side field plate effect". This relaxation of electric field concentration leads to increase in breakdown voltage. Further this relaxation leads to suppression of current collapse, which further leads to low resistance in the ON state of the device. The parasitic capacitance and the back side field plate effect are controllable by properly selecting which of the layers is non-doped or lightly-doped and controlling the concentration of the dopant, if lightly-doped.

Figure 5:
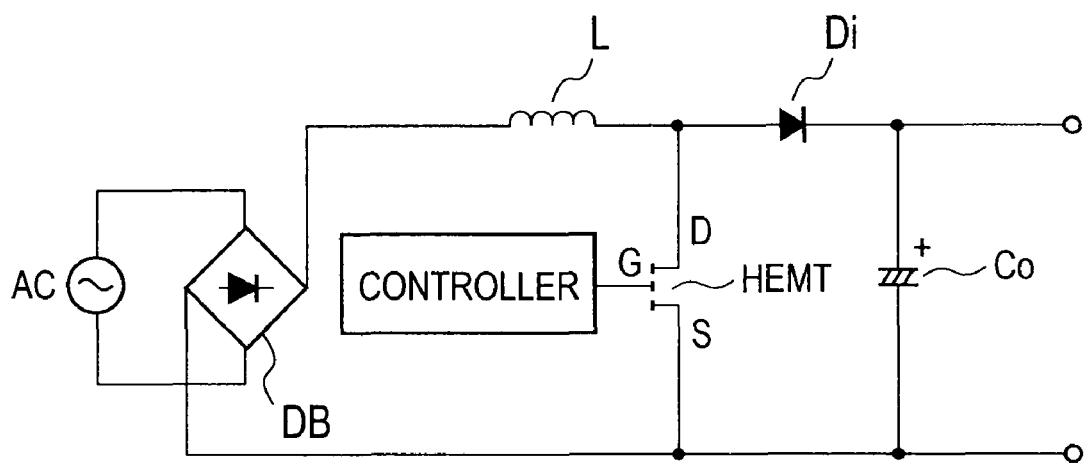
FIG. 5 is a circuit diagram in which any of the HEMT devices is used as a switching device.

Any of the HEMTs as structured in accordance with the above description can be used as a switching device for a power source circuit as illustrated in FIG. 5. Of course, the HEMTs can be used in any circuits requiring a high-speed switching property or a good high-frequency property.

Although the invention has been described above by reference to certain embodiments of the invention, the invention is not limited to the embodiments described above.

Modifications and variations of the embodiments described above will occur to those skilled in the art, in light of the above teachings.

What is claimed is:

1. A semiconductor substrate serving for production of a semiconductor device, comprising:
   a base substrate;
   a multilayer being formed on the base substrate and having a surface serving for an interface with the semiconductor device, the multilayer including alternating layers of a first compound semiconductor and a second compound semiconductor materially distinguishable from the first compound semiconductor, one of the first compound semiconductor and the second compound semiconductor being doped with carbon; and
   a device layer including a first region formed on the surface of the multilayer and a second region forming a hetero junction with the first region,
   wherein the first region includes a dopant selected from the group consisting of carbon and transition elements.

2. The semiconductor substrate of claim 1, wherein the first compound semiconductor includes one selected from the group consisting of nitride compound semiconductors, and the second compound semiconductor includes another selected from the group consisting of nitride compound semiconductors.

3. The semiconductor substrate of claim 1, wherein the first compound semiconductor includes one selected from the group consisting of gallium nitride, indium nitride, aluminum nitride and any compound crystals of gallium nitride, indium nitride, aluminum nitride, and the second compound semiconductor includes another selected from the group consisting of gallium nitride, indium nitride, aluminum nitride and any compound crystals of gallium nitride, indium nitride, aluminum nitride.

4. The semiconductor substrate of claim 1, wherein the second compound semiconductor has a narrower band gap than the first compound semiconductor and is doped with one selected from the group consisting of carbon and transition elements.

5. The semiconductor substrate of claim 1, wherein a dopant concentration of one of the layers of the multilayer is lower than dopant concentration of the other layers of the multilayer.

6. The semiconductor substrate of claim 1, wherein the base substrate consists essentially of one selected from the group consisting of silicon and silicon carbide.

7. A semiconductor device comprising:
   a base substrate consisting essentially of one selected from the group of silicon and silicon carbide;
   a multilayer being formed on the base substrate and having a surface, the multilayer including alternating layers of a first compound semiconductor and a second compound semiconductor materially distinguishable from the first compound semiconductor, one of the first compound semiconductor and the second compound semiconductor being doped with carbon;
   a device layer including a first region formed on the surface of the multilayer and a second region forming a hetero junction with the first region; and
   first and second contacts being apart from each other and respectively forming ohmic contacts with the device layer,
   wherein the first region includes a dopant selected from the group consisting of carbon and transition elements.

* * * * *